United States Patent [19]

Hassner et al.

[11] Patent Number: 5,384,567
[45] Date of Patent: Jan. 24, 1995

[54] COMBINATION PARALLEL/SERIAL EXECUTION OF SEQUENTIAL ALGORITHM FOR DATA COMPRESSION/DECOMPRESSION

[75] Inventors: Martin A. Hassner, Palo Alto, Calif.; Ehud D. Karnin, Koranit, Israel; Uwe Schwiegelshohn, Mohegan Lake, N.Y.; Tetsuya Tamura, Yamato, Japan

[73] Assignee: International Business Machines Corporation, Armonk, N.Y.

[21] Appl. No.: 89,211

[22] Filed: Jul. 8, 1993

[51] Int. Cl.⁶ .............................................. H03M 7/30
[52] U.S. Cl. ....................................... 341/51; 341/106
[58] Field of Search ........................... 341/50, 51, 106

[56] References Cited

U.S. PATENT DOCUMENTS

| | | | |
|---|---|---|---|
| 4,739,308 | 4/1988 | Lienard | 341/67 |
| 4,937,574 | 6/1990 | Wright | 341/106 |
| 5,179,378 | 1/1993 | Ranganathan et al. | 341/51 |

OTHER PUBLICATIONS

Jacob Ziv and Abraham Lempel, "A Universal Algorithm for Sequential Data Compression," IEEE Transactions on Information Theory, vol. IT-23, No. 3, May 1977, pp. 337-343.

*Primary Examiner*—Marc S. Hoff
*Attorney, Agent, or Firm*—Henry E. Otto, Jr.

[57] ABSTRACT

An apparatus and method for executing a sequential data compression algorithm that is especially suitable for use where data compression is required in a device (as distinguished from host) controller. A history buffer compresses an array of i identical horizontal slice units. Each slice unit stores j symbols to define j separate blocks in which the symbols in each slice unit are separated by exactly i symbols. Symbols in a string of i incoming symbols are compared by i comparators in parallel with symbols previously stored in the slice units to identify matching sequences of symbols. A control unit controls execution of the sequential algorithm to condition the comparators to scan symbols in parallel but in each of the blocks sequentially and cause matching sequences and nonmatching sequences of symbols to be stored in the array. The parameters i and j are selected to limit the number of comparators required to achieve a desired degree of efficiency in executing the algorithm based upon a trade-off of algorithm execution speed versus hardware cost. A priority encoder calculates from signals output by the slice units each j,i address in which a matching sequence is identified, but it outputs the address of only one (such as the smallest) of these addresses.

9 Claims, 4 Drawing Sheets

COMBINATION PARALLEL/SERIAL EXECUTION OF SEQUENTIAL ALGORITHM FOR DATA COMPRESSION/DECOMPRESSION

FIELD OF THE INVENTION

This invention relates to apparatus and methods for compressing and decompressing data in data storage systems, and more particularly to an apparatus and method involving block parallel execution of a sequential data compression algorithm that is especially suitable for use in low end data storage systems.

BACKGROUND OF THE INVENTION

It is known that the efficiency with which data can be compressed and decompressed depends primarily on the buffer size and encoding implementation used. Executing a compression/decompression algorithm using software is slow and therefore not suited for high speed or real time applications. Executing the algorithm using hardware requires an amount of hardware that varies according to the degree of parallelism of the implementation technique employed. If too much hardware is required, it may be difficult to integrate the data compression algorithm into a controller.

A paper by Lempel and Ziv entitled "A Universal Algorithm for Sequential Data Compression", published in IEEE Transactions on Information Theory, May 1977, at pp. 337-343, describes an algorithm for efficiently compressing data.

This Lempel-Ziv 1 (LZ1) algorithm is a sequential algorithm that compresses strings of binary data of variable length into a fixed length compressed binary format. It is implemented using a history buffer that contains the most recent bytes or words of a file in the correct sequence. Methodically, by repeated executions of a basic routine, new bytes are read as long as the sequence of incoming bytes is matched by a sequence in the history buffer, thereby generating a sequential stream of data. Since each incoming byte is sequentially compared with each byte in the history buffer, a significant amount of computation time is required, making this technique unsuitable for real time applications.

Commonly assigned U.S. Ser. No. 07/807,007, filed Dec. 31, 1991, (Docket AT991-030) describes a typical implementation of the LZ1 algorithm and then cites a number of patents (not deemed material to the present invention) which cover techniques toward improving the speed with which the LZ1 algorithm is executed or the amount of compression achieved.

This cited commonly assigned application describes a fully parallel architecture that implements the LZ1 algorithm in hardware. With a content addressable memory (CAM) serving as a history buffer, each incoming byte is compared simultaneously with all the bytes in the history buffer. This fully parallel hardware approach desirably provides the fastest execution of the LZ1 algorithm. However, it requires a separate comparator for each distinct buffer position (i.e., CAN address) and can only achieve the maximal efficiency (speed/hardware performance) when the history buffer is full; namely, after an initial loading period for each sector or input data field of the data storage medium. Therefore, if the sector is approximately the same size as the history buffer, the fully parallel implementation will require many redundant operations.

Since the size of a device controller chip is essentially the same as that of the chip needed to implement the purely parallel compression, a parallel compression chip cannot efficiently be used to perform compression in a device controller. The principal use for this fully parallel approach is for host data compression, where the compression chip is located in the host controller.

There is a need for a data compression/decompression apparatus and method which implements the LZ1 algorithm by use of a modular architecture that:

1. Divides the history buffer into a plurality of blocks, compares all bytes in a block in parallel, and scans the blocks sequentially;

2. Enables a designer to select any speed ranging from the slow sequential execution of the LZ1 algorithm to the above-described optimal parallel implementation by selecting a desired degree of parallelism in order to limit hardware costs to the needs of a particular application;

3. Is especially suitable for applications in which the data compression is performed in a device controller, where the required execution speed is approximately an order of magnitude less than that required to perform compression in a host controller; and 4. Is especially advantageous when an input data sector and history buffer contain approximately the same number of bytes.

SUMMARY OF THE INVENTION

An apparatus and method are described for executing a sequential data compression algorithm that is especially suitable for use where data compression is required in a device (as distinguished from host) controller. A history buffer compresses an array of i identical horizontal slice units. Each slice unit stores j symbols to define j separate blocks in which the symbols in each slice unit are separated by exactly i symbols. Symbols in a string of i incoming symbols are compared by i comparators in parallel with symbols previously stored in the slice units to identify matching sequences of symbols. A control unit controls execution of the sequential algorithm to condition the comparators to scan symbols in parallel but in each of the blocks sequentially and cause matching sequences amid nonmatching sequences of symbols to be stored in the array. The parameters i and j are selected to limit the number of comparators required to achieve a desired degree of efficiency in executing the algorithm based upon a trade-off of algorithm execution speed versus hardware cost.

A priority encoder calculates from signals output by the slice units each j,i address in which a matching sequence is identified, but it outputs the address of only one (such as the smallest) of these addresses. Incoming symbols are written serially into successive symbol positions in the buffer until all buffer positions are filled and then the oldest symbol string in the buffer is replaced with the incoming symbol.

DESCRIPTION OF PREFERRED EMBODIMENT

Figure 1:
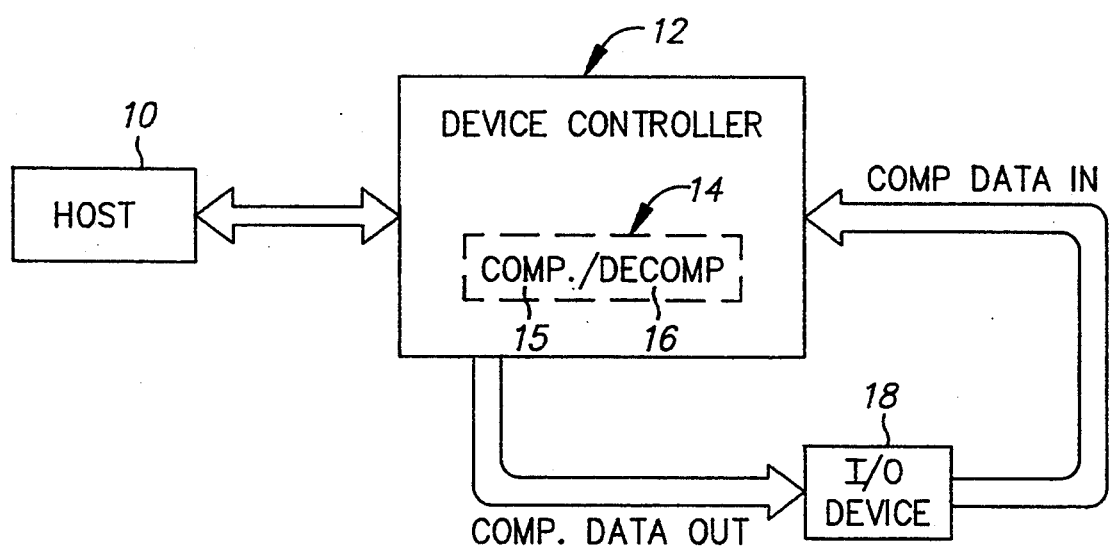
FIG. 1 is a block diagram of a data processing system embodying the invention.

As illustrated in FIG. 1, a data processing system embodying the invention comprises a host computer 10 which transmits data to and receives data from a device controller 12 that includes compression/decompression apparatus 14. Apparatus 14 comprises a compression engine 15 and a decompression engine 16 which can be invoked, respectively, to compress and decompress data. Engine 15 provides compressed data output to an input/output (I/O) device 18, such as a disk drive comprising a plurality of disks. Device 18 provides compressed data input to the decompression engine 16 of device controller 12.

Figure 2:
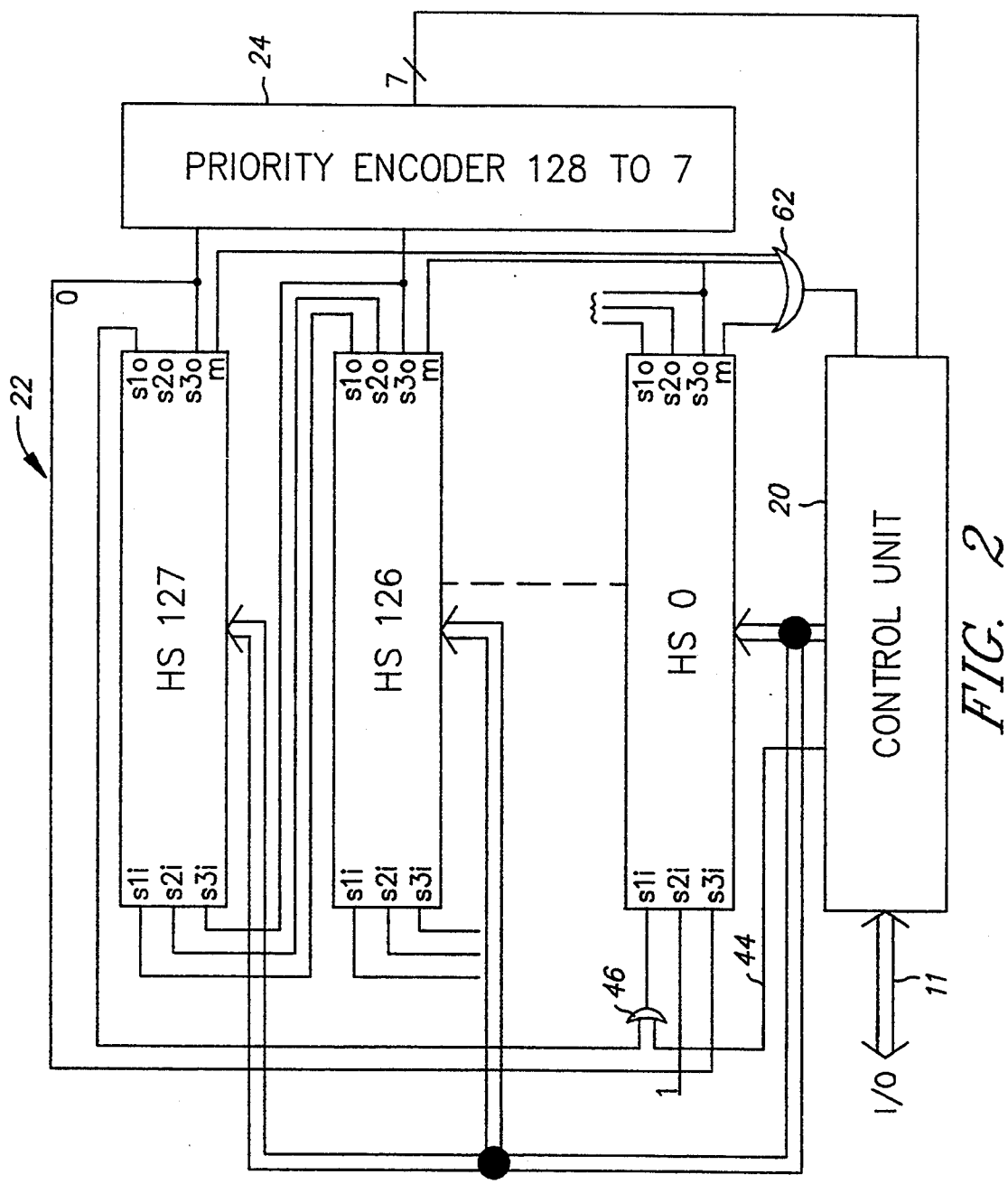
FIG. 2 is a schematic diagram of a data compression/decompression apparatus embodying the invention and including an array of identical horizontal slice units and a priority encoder.

As illustrated ill FIG. 2, data compression/decompression apparatus 14 comprises a control unit 20, a history buffer 22, and a priority encoder 24. Input/output (I/O) bus 11 conveys data to and from control unit 20. The data is in the form of "symbols", a term used in the claims generically to connote bytes, halfwords, words, or any other preselected number of bits. However, to facilitate understanding, the data is herein assumed to be in the form of bytes.

As illustrated, history buffer 22 consists of an array of 128 identical horizontal slice units HS0 to HS127, each of which stores four bytes, for thereby partitioning the buffer into four 128-byte stored blocks. This modular architecture creates a history buffer 22 capable of storing 512 (128×4) consecutive bytes in which the bytes in each HS unit are separated by exactly 128 bytes (i.e., one block size) and each HS unit stores four bytes, one from each block.

Each byte b in buffer 22 has a unique address which is identified by its block index B and HS index. Thus, for bytes 0–127, the block index B is 0; for bytes 128–255, the block index B is 1; for bytes 256–383, the block index B is 2; and for bytes 384–511, the block index B is 3. The HS index is the byte address mod block size.

Thus, the address of byte 356 would be [3,100]. Four bytes b, one from each block at the same HS address 0 ... 127, comprise a word W whose address in this case would be (1,L;2,L;3,L;4,L) where L is a specific HS address. With the 4×128-byte buffer illustrated, if the address of a byte is expressed in binary format, the block index can be denoted by the two most significant bits and the HS unit index can be denoted by seven less significant bits.

Figure 3:
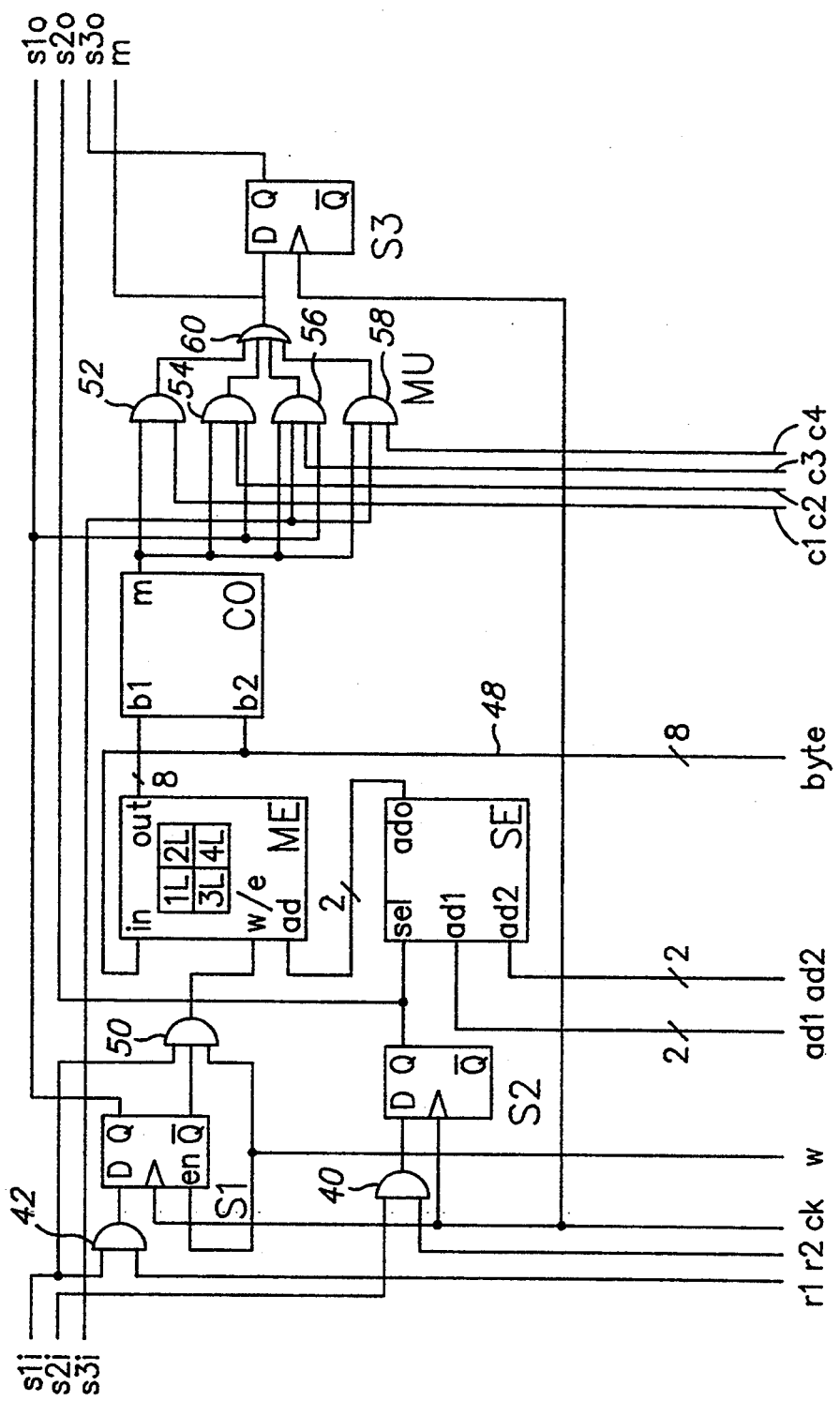
FIG. 3 is a schematic diagram showing in detail the configuration of each of the horizontal slice units shown in FIG. 2.

Referring now to FIG. 3, each HS unit comprises a memory register or cell ME, an address selector cell SE, a comparator cell CO, a multiplexer MU and latches S1, S2, S3. Controller 20 transmits to each HS unit the same 8-bit byte of an incoming symbol string and four signals c1–c4 that control the multiplexer MU of that HS unit. Controller 20 also provides in parallel to each HS unit; signals r1 and r2 for use in resetting latches S1 and S2, respectively; block address selecting signals ad1 and ad2, respectively; a clock signal ck that synchronizes operation of all HS units; and a write enable signal w.

Each HS unit has outputs s1o, s2o, S3o which represent the current states of the respective latches S1, S2, S3. These outputs constitute the inputs s1i, s2i, s3i (see FIG. 2) for the next successive HS unit in a cyclical manner, with the outputs s1o, s3o from HS127 being the inputs s1i, s3i to HS0. Multiplexer MU uses the control signals c1–c4, and generates an output m.

In operation, assume the content of buffer 22 (i.e., 1L, 2L, 3L, 4L, S1, S2, S3) is undefined. This state occurs whenever a new sector is compressed. Initially, a signal r1 is sent in parallel by control unit 20 to AND gate 42 in all HS units to reset the latches S1 in all HS units. A byte can only be written into a location in the memory cell of a given HS unit under the following conditions:

1. The write enable signal w from control unit 20 must be "1".
2. Latch S1 of this HS unit must be "0" (i.e., in reset state).
3. Input S1i to this HS unit must be "1".

These conditions are satisfied with the AND gate 50 as shown in FIG. 3. When a block is full, the latches S1 of all HS units except the last one (here, HS127) are set (i.e., are "1"0). The HS unit with S1="0" is the location where the new incoming byte replaces an old byte in buffer 22. However, since the S1 latches of all HS units initially have the value "0", control unit 20 provides a "1" signal via line 44 and OR gate 46 (FIG. 2). This "1" signal is maintained until the S1 latches of all HS units except the last one (here, HS127) are "1". This procedure is repeated (i.e., resetting of the S1 latches in all HS units and maintaining the initializing "1" signal on line 44) until all blocks are full; whereupon the signal on line 44 is switched by control unit 20 to "0".

The latch S1 of each HS unit also provides the output s1o of that unit. Consequently, the S1 latches of all HS units act as a 128-bit shift register. This shift register is updated by write enable signal w which is transmitted in parallel to all HS units from control unit 20.

Write enable signal w also causes an incoming byte from line 48 to be written into the memory cell ME of the HS unit. The location is determined by the latches S1 and inputs s1i to be one of the locations 1L, 2L, 3L or 4L as determined by the selector unit SE. One of the advantages of the latches S1 is the fact that the memory cells need not be reset at the beginning of a new sector, thus reducing power consumption. This feature is of practical importance in a device controller implementation where power dissipation is critical due to battery power source limitations.

To initiate a string comparison operation with a new block, control unit 20 sends a signal r2 in parallel to all HS units to reset latch S2 via AND gate 40. The output of s2 controls the selector cell SE in each HS unit. Also, control unit 20 sends two signals ad1 and ad2 to the SE cells of all HS units. These two-bit signals ad1 and ad2 denote adjacent block addresses (e.g., B1 and B2). Depending on the state of latch S2 in each HS unit, either ad1 or ad2 becomes the determining block address ad0 for that HS unit. Initially because all S2 latches are reset, ad0 equals ad1 for all HS units. The output of the S2 latch of an HS unit becomes output S2o and then input s2i for the next HS unit.

Thus all latches S2 form a 128-bit shift register whose input (s2i from HS0) is always "1". As matching of the input byte string with the content of the buffer 22 continues, this shift register is filled with "1"s from the bottom, thus causing more and more HS units to select ad2 instead of ad1. This constitutes a virtual shifting of the block boundaries during the matching process. For example, assume there has been a match up to byte 255 in buffer 22 (i.e., up to byte address [2,127]). Then, the next incoming byte has to be compared with byte 256 in the buffer, which has a different block address, namely, [3,0].

The incoming byte is also transmitted via branches of line 48 to a corresponding comparator cell CO in each HS unit. The comparator cells CO in all, 128 HS units compare the incoming byte simultaneously with 128 bytes in that particular one of the four blocks chosen by the selector cells SE. If the output byte from one of the memory cells ME matches the incoming byte in line 48, comparator CO will provide a "1" output signal m to multiplexor unit MU.

Multiplexor unit MU is conditioned by control unit 20 into one of four modes or states, as determined by the signals c1-c4. The functions implemented by these signals are as follows:

Signal c1 denotes that the incoming byte will be the first byte of a new matching string and that the block which is currently active (i.e., whose address is given by ad0) is full. In this event, the state of latch S1 can be ignored.

Signal c2 denotes that the incoming byte will also be the first byte of a new matching string but that the currently active block is not yet full (i.e., the contents of some memory locations in this block are undefined, and therefore a match can only occur when latch S1 is "1".

Signal c3 denotes that the incoming byte is not the first byte of a matching string, and that the state of latch S1 cannot be ignored. This condition can only occur if the whole buffer is full and the shifting area of one block overlaps with the area of another block into which bytes of the matching string are going to be written.

Signal c4 denotes that the incoming byte is not the first byte in a matching string but that the state of latches S1 can be ignored.

If an incoming byte is not the first byte of a matching string, then a continued match requires that the preceding byte must also have been matched, a condition which is denoted by the input signal s3i from the preceding HS unit.

Thus, when the multiplexor MU is conditioned by signal c1 or c2, the signal s3i can be ignored because s3i denotes the match of an initial byte of a string. The m signal of comparator cell CO is selectively ANDed with signal c1 at 52, with signals c2 and s1o at 54, with signals c3 and s1o and s3i at 56, and with signals c4 and s3i at 58. The outputs of the respective AND gates 52, 54, 56 and 58 are ORed at 60, generating the output signal m. If the output signal m is "1", it denotes that a matching string in buffer 22 has been extended to include the most recent incoming byte. The m outputs of all HS units are ORed at gate 62 (FIG. 2) to signal control unit 20 that the present input sequence has found an active match in the currently active block. This output signal m of an HS unit is also input to the latch S3. Therefore, if the output s3o of latch S3 of an HS unit is "1", it means that the buffer location determined by this unit and the address ad0 is the thus far last byte of a previously stored sequence that matches the most recent input sequence. The s3o outputs of each HS unit are connected to priority encoder 24.

It should be noted that updating of buffer 22 is independent of and can be done concurrently with a string comparison operation.

Priority encoder 24 uses the s3o outputs from the 128 HS units to calculate and encode the ending address of a sequence in history buffer 22 that matches the most recent sequence in the incoming data to be compressed. In a parallel implementation, such as herein described, more than one sequence in the history buffer 22 may match the incoming sequence. In such event, according to a feature of the invention, encoder 24 will provide only a single ending address for a matching sequence.

Figure 4:
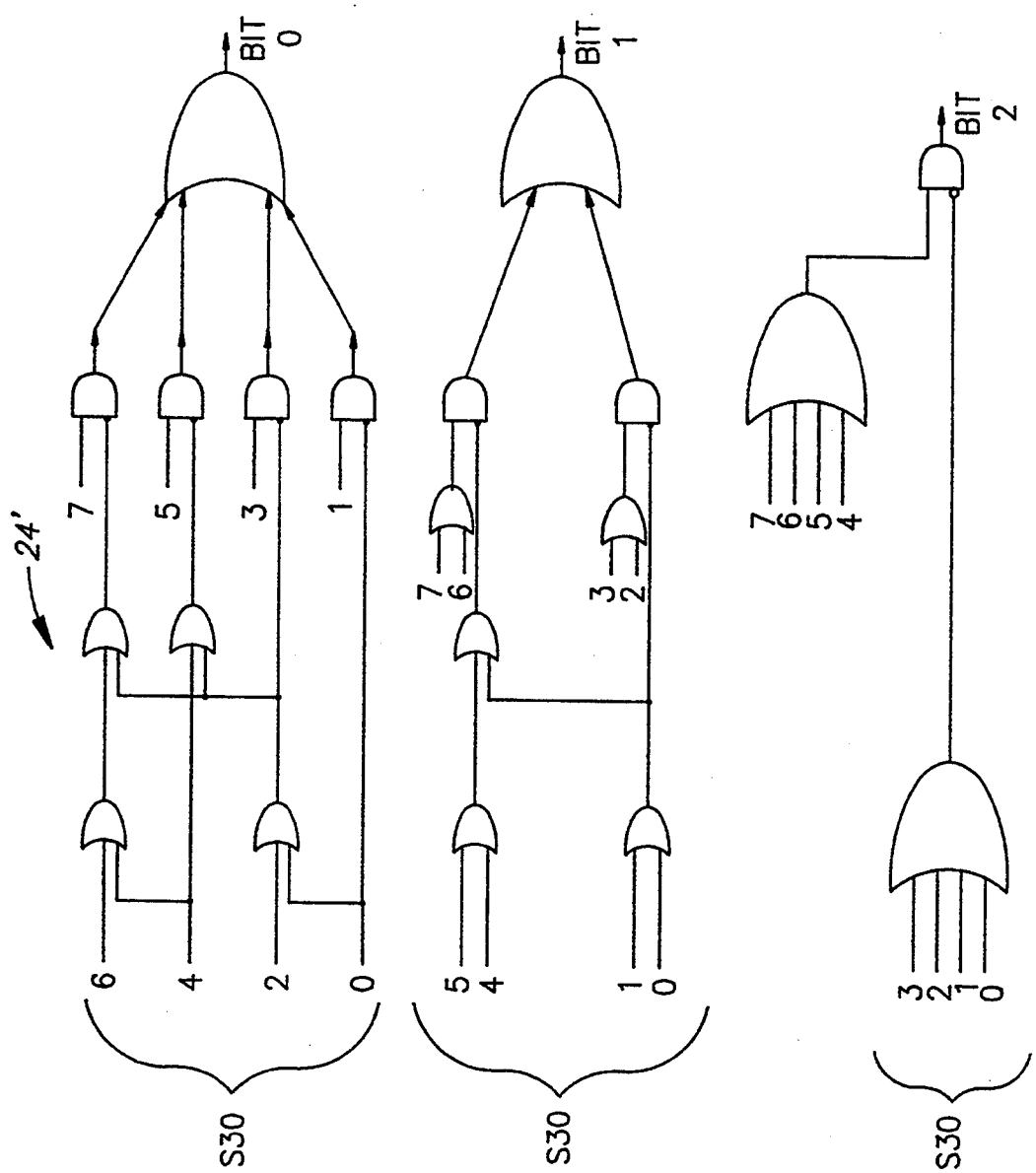
FIG. 4 depicts a circuit logic diagram of a simplified version of the priority decoder shown in FIG. 2.

The manner in which this singular ending address is selected will be demonstrated by reference to the simplified priority encoder 24' illustrated in FIG. 4. This encoder encodes 512 bytes, but to simplify the drawing and description assumes there are only 8 HS units, each storing 64 bytes, one from each of 64 blocks, to encode into only three bits (rather than the seven bits that would be necessary to convert the address from 128 HS units of the type shown in FIG. 3.)

As illustrated in FIG. 4, the simplified priority encoder 24' receives as inputs the eight s3o signals from all (now 8) HS units. It then determines the lowest of the eight indices among the HS units for which s3o is "1". This is achieved by the logic illustrated in FIG. 4 which ignores all the s3o signals except the one with the smallest HS address. Thus, it determines a unique ending address of a matched sequence. This address is sent to control unit 20.

Since the decompression algorithm requires the starting address of a matching sequence, it is necessary to calculate this starting address from the ending address provided by the priority encoder 24. Since it is known that the matching sequence started in the currently active block (all S2 latches were reset initially), it is only necessary to calculate the last seven bits of the address. This can be done by simply subtracting the length of the matching sequence; i.e., subtracting the number of bits in this sequence from the ending address and taking the result mod the number of HS units (128 in the embodiment illustrated in FIG. 3). The length of the matching sequence is part of the compressed data and therefore available in the control unit 20 where it is easily obtained with an incrementing counter.

The algorithm for decompressing the data, which has been compressed by applicants' modified LZ1 compression algorithm, is inherently sequential and therefore independent of the degree of parallelism used in compression engine 15. However, for efficient hardware usage, the history buffer 22 of compression engine 15 is used. The compressed incoming data consists of a starting buffer address, a string length number, and a character that is the last symbol in the compressed string. Control unit 20 extracts the buffer content at the initial address and updates buffer 22 with the extracted symbol in the same fashion as compression engine 15. This step is repeated for the length of the compressed string. During this process, the buffer address is constantly incremented in a cyclical fashion. Finally, the last symbol is also sent to host 10, and the control unit 20 is once again ready to receive the data of the next compressed string.

Attached hereto as APPENDIX A is a program in C language for implementing the LZ1 compression algorithm as modified according to the invention. Also attached, as APPENDIX B, is a program in C language for decompressing data compressed by use of applicants' modified LZ1 compression algorithm. The programs in both Appendices are provided with comments to provide additional explanation of the sequences of steps in implementing applicants' invention.

While the invention has been particularly shown and described with reference to a preferred embodiment thereof, it will be understood by those skilled in the art that various changes in form and detail may be made without departing from the spirit and scope of the invention. Hence, the invention is not to be deemed limited except as required by the claims.

We claim:

1. An apparatus for executing a sequential data compression algorithm, comprising:
   an array of i identical horizontal slice units, each of which stores j symbols to define j separate blocks in which the symbols in each slice unit are separated by exactly i symbols, i and j being positive integers larger than 1;
   i comparators to compare symbols in a string of i incoming symbols in parallel with i noncontiguous symbols, one from each block, previously stored in said slice units to identify matching sequences of symbols; and
   means, including controller means, for (i) executing the sequential algorithm to condition the comparators to scan symbols in parallel but in each of said blocks sequentially, and (ii) cause matching sequences and nonmatching sequences of symbols to be stored in said array.

2. The apparatus of claim 1, wherein the location address of each stored symbol is uniquely specified by an indexing rule, such that k equals m times i, where k varies from 1 to j and m varies from 1 to N/i, and N, the size of the array, is i times j.

3. An apparatus for executing a sequential data compression algorithm, comprising:
   an array of i identical horizontal slice units, each of which stores j symbols to define j separate blocks in which the symbols in each slice unit are separated by exactly i symbols, i and j being positive integers larger than 1;
   i comparators to compare symbols in a string of i incoming symbols in parallel with symbols previously stored in said slice units to identify matching sequences of symbols;
   each slice unit providing an output signal which is of one state if a matching sequence is identified;
   a priority encoder for calculating from said output signals each j,i address in which a matching sequence is identified, but outputting only one of said addresses; and
   means, including controller means, for (i) executing the sequential algorithm to condition the comparators to scan symbols in parallel but in each of said blocks sequentially, and (11) cause matching sequences and nonmatching sequences of symbols to be stored in said array.

4. The apparatus of claim 3, wherein each output signal when in said one state identifies the thus far last byte of a previously stored sequence that matches the most recent sequence in the string of incoming symbols.

5. The apparatus of claim 3, including:
   means for inhibiting application of the algorithm to any blocks which do not contain symbols.

6. The apparatus of claim 3, including:
   a single latch in each respective one of the slice units, which latches are serially connected and in combination constitute a shift register; and
   means for resetting said latches and hence said shift register each time before symbols are stored in a different location in said array.

7. A method of executing a sequential data compression algorithm, comprising the steps of:
   providing an array of i identical horizontal slice units, each for storing j symbols to define j separate blocks in which the symbols in each slice unit are separated by exactly i symbols, i and j being positive integers larger than 1;
   using i comparators, comparing symbols in a string of i incoming symbols in parallel with symbols previously stored in said slice units to identify matching sequences of symbols;
   executing the sequential algorithm by (i) scanning symbols in parallel but in each of said blocks sequentially, and (ii) storing matching sequences and nonmatching sequences of symbols in an input/output device; and
   inhibiting application of the algorithm to any blocks which do not contain valid symbols.

8. The method of claim 7, including the steps of:
   calculating each j,i address in which a matching sequence is identified; and
   outputting the address of only the smallest one of said addresses.

9. The method of claim 7, including the step of:
   identifying the thus far last byte of a previously stored sequence that matches the most recent sequence in the string of incoming symbols.

* * * * *